US012722248B2

(12) United States Patent
Maejima et al.

(10) Patent No.: US 12,722,248 B2
(45) Date of Patent: Sep. 1, 2026

(54) PROCESSING APPARATUS

(71) Applicant: DISCO CORPORATION, Tokyo (JP)

(72) Inventors: Makoto Maejima, Tokyo (JP); Yuto Maeda, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 414 days.

(21) Appl. No.: 18/493,149

(22) Filed: Oct. 24, 2023

(65) Prior Publication Data

US 2024/0149393 A1 May 9, 2024

(30) Foreign Application Priority Data

Nov. 4, 2022 (JP) ................................ 2022-177156
Sep. 11, 2023 (JP) ................................ 2023-146783

(51) Int. Cl.

*B24B 41/06* (2012.01)
*B24B 7/04* (2006.01)
*B24B 7/22* (2006.01)
*B24B 51/00* (2006.01)
*H10P 52/00* (2026.01)

(52) U.S. Cl.

CPC .............. *B24B 41/068* (2013.01); *B24B 7/04* (2013.01); *B24B 7/228* (2013.01); *H10P 52/00* (2026.01); *B24B 51/00* (2013.01)

(58) Field of Classification Search

CPC ......... B24B 7/04; B24B 7/228; B24B 41/068; B24B 1/00; H01L 21/304
See application file for complete search history.

(56) References Cited

U.S. PATENT DOCUMENTS 7,278,903 B2 * 10/2007 Masuda .............. B24B 27/0076 451/28
7,758,402 B2 * 7/2010 Yoshida .................. B24B 7/228 438/959
8,657,648 B2 * 2/2014 Yamanaka ............ H01L 21/304 451/333
11,817,337 B2 * 11/2023 Kodama ................. B24B 7/228

FOREIGN PATENT DOCUMENTS

JP 2007019461 A 1/2007
JP 2008042081 A 2/2008

* cited by examiner

*Primary Examiner* — Justin D Seabe
(74) *Attorney, Agent, or Firm* — Greer Burns & Crain Ltd.

(57) ABSTRACT

A processing apparatus includes a rotatable turntable and four chuck tables disposed on the turntable. When the turntable with the four chuck tables disposed thereon is intermittently turned about its central axis, the wafer held on each of the chuck tables is moved to and positioned in a first processing position, a second processing position, and a third processing position where the wafer is processed. Three types of processing processes are able to be carried out on the wafers without the wafers being spaced from holding surfaces of the chuck tables.

13 Claims, 7 Drawing Sheets

PROCESSING APPARATUS

BACKGROUND OF THE INVENTION

Field of the Invention

The present invention relates to a processing apparatus.

Description of the Related Art

As disclosed in Japanese Patent Laid-Open No. 2008-042081 and Japanese Patent Laid-Open No. 2007-019461, there is known a wafer grinding method in which a central portion of a wafer held on a holding surface of a chuck table is ground to form a recess therein, leaving an annular land on an outer peripheral portion of the wafer around the central portion. According to the wafer grinding method, coarse grindstones are used to grind the central portion of the wafer to form the recess therein, and then finishing grindstones are used to grind the bottom of the recess, removing surface irregularities therefrom.

Some wafers have a metal layer in the bottom of the recess. In order to thin down the metal layer, it is desirable to give the bottom a mirror finish by further removing surface irregularities from the bottom. A mirror finish may be given to the bottom by grinding the bottom with precision grindstones whose abrasive grains are smaller than the finishing grindstones after grinding the bottom with the finishing grindstones or by polishing the bottom with a polishing pad.

SUMMARY OF THE INVENTION

While the three types of processing tools, i.e., the coarse grindstones, the finishing grindstones, and the precision grindstones or the polishing pad, as described above, are being applied to process the bottom of the recess, the wafer should not be spaced from the holding surface of the chuck table, i.e., the wafer should preferably stay in contact with the holding surface of the chuck table in order to keep the grindstones or the polishing pad in an appropriate position with respect to the recess in the wafer.

In accordance with an aspect of the present invention, there is provided a processing apparatus for grinding a central portion of a wafer to form a circular recess in the wafer and an annular land surrounding the circular recess. The processing apparatus includes a turntable, at least four chuck tables rotatably mounted on the turntable and having respective holding surfaces for holding respective wafers thereon, a delivery mechanism for loading a wafer onto and unloading a wafer from each of the chuck tables, a first processing mechanism for grinding the wafer held on one of the holding surfaces with a first annular grinding wheel to form a circular recess in a central portion of the wafer, leaving an annular land around the circular recess, a second processing mechanism for grinding a bottom of the circular recess in the wafer held on the holding surface with a second annular grinding wheel, a third processing mechanism for grinding the bottom of the circular recess in the wafer held on the holding surface with a third annular grinding wheel or polishing an upper surface of the wafer with a first polishing pad, a first horizontally moving mechanism for moving the first annular grinding wheel of the first processing mechanism radially with respect to the wafer held on the one of the holding surfaces, a second horizontally moving mechanism for moving the second annular grinding wheel of the second processing mechanism radially with respect to the wafer held on the holding surface, and a third horizontally moving mechanism for moving the third annular grinding wheel or the first polishing pad of the third processing mechanism radially with respect to the wafer held on the holding surface.

Preferably, the chuck tables are movable to and positionable in a processing position at the first processing mechanism, a processing position at the second processing mechanism, a processing position at the third processing mechanism, and a delivery position into and from which each of the wafers is able to be loaded and unloaded by the delivery mechanism when the turntable is intermittently turned about its central axis. The processing apparatus further includes a polishing mechanism for grinding an upper surface of the wafer held on the chuck table in the delivery position with a second polishing pad.

Preferably, the chuck tables are movable to and positionable in a processing position at the first processing mechanism, a processing position at the second processing mechanism, a processing position at the third processing mechanism, and a delivery position into and from which each of the wafers is able to be loaded and unloaded by the delivery mechanism when the turntable is intermittently turned about its central axis. The processing apparatus further includes an outer circumferential upper surface grinding mechanism for grinding at least a portion, to be made into the annular land, of an upper surface of the wafer held on the chuck table in the delivery position with an outer circumferential upper surface grinding wheel.

In accordance with another aspect of the present invention, there is provided a processing apparatus for grinding a central portion of a wafer to form a circular recess in the wafer and an annular land surrounding the circular recess. The processing apparatus includes a turntable, at least four chuck tables rotatably mounted on the turntable and having respective holding surfaces for holding respective wafers thereon, a delivery mechanism for loading a wafer onto and unloading a wafer from each of the chuck tables, a second processing mechanism for grinding the wafer held on one of the holding surfaces with a second annular grinding wheel to form a circular recess in a central portion of the wafer, leaving an annular land around the circular recess, a third processing mechanism for grinding a bottom of the circular recess in the wafer held on the holding surface with a third annular grinding wheel or polishing an upper surface of the wafer with a first polishing pad, a fourth processing mechanism for grinding at least a portion, to be made into the annular land, of an upper surface of the wafer held on the holding surface with a fourth annular grinding wheel, a second horizontally moving mechanism for moving the second annular grinding wheel of the second processing mechanism radially with respect to the wafer held on the one of the holding surfaces, a third horizontally moving mechanism for moving the third annular grinding wheel or the first polishing pad of the third processing mechanism radially with respect to the wafer held on the holding surface, and a fourth horizontally moving mechanism for moving the fourth annular grinding wheel of the fourth processing mechanism radially with respect to the wafer held on the holding surface.

Preferably, the chuck tables are movable to and positionable in a processing position at the second processing mechanism, a processing position at the third processing mechanism, a processing position at the fourth processing mechanism, and a delivery position into and from which each of the wafers is able to be loaded and unloaded by the delivery mechanism when the turntable is intermittently turned about its central axis. The processing apparatus further includes a polishing mechanism for polishing an upper surface of the wafer held on the chuck table in the delivery position with a second polishing pad.

When the turntable with the chuck tables disposed thereon is intermittently turned about its central axis, the wafer held on each of the chuck tables is moved to and positioned in the processing positions at the three processing mechanisms where the wafers are processed. Three types of processing processes are thus carried out on the wafers without the wafers being spaced from holding surfaces of the chuck tables. In the types of processing processes, the wafers are effectively prevented from being shifted in position on the holding surfaces.

Consequently, the processing tools of the three processing mechanisms can be placed in appropriate positions with respect to the wafers. Therefore, the three types of processing processes can be carried out on the wafers without causing damage to the circular recesses and the annular lands on the wafers.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
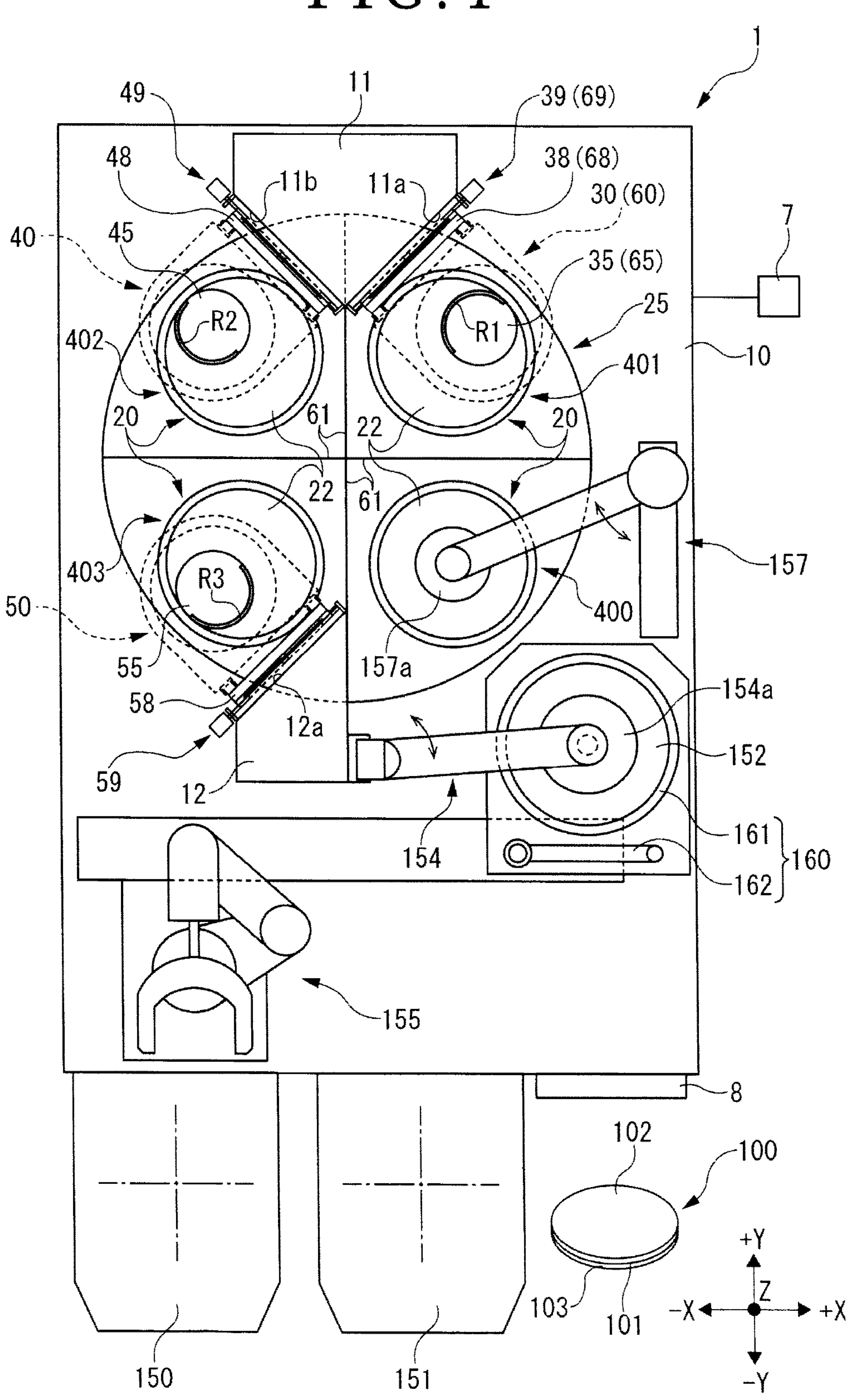
FIG. 1 is a top plan view illustrating structural details of a processing apparatus according to a first embodiment of the present invention.

As illustrated in FIG. 1, a processing apparatus 1 according to a first embodiment of the present invention includes a first processing mechanism 30, a second processing mechanism 40, a third processing mechanism 50, and a controller 7. The controller 7 controls the first processing mechanism 30, the second processing mechanism 40, and the third processing mechanism 50 to grind or polish a wafer 100 held on a chuck table 20.

The processing apparatus 1 according to the present embodiment and the processing apparatus according to other embodiments to be described later are illustrated in reference to a three-dimensional coordinate system having an X-axis, a Y-axis, and a Z-axis (see FIGS. 1, 7, and 9). The X-axis and the Y-axis extend horizontally and perpendicularly to each other, and the Z-axis extends vertically and perpendicularly to the X-axis and the Y-axis. A +X direction and a −X direction extend opposite each other along the X-axis, and a +Y direction and a −Y direction extend opposite each other along the Y-axis.

According to the present embodiment, the processing apparatus 1 grinds a central portion of the wafer 100 to form a circular recess therein, leaving an annular land around the circular recess. Stated otherwise, the processing apparatus 1 is arranged to form the circular recess in the central portion of the wafer 100 and the annular land surrounding the circular recess on an outer circumferential portion of the wafer 100. The processing apparatus 1 performs what is generally called the TAIKO (registered trademark in Japan) grinding process on the wafer 100.

The wafer 100 illustrated in FIG. 1 is an example of a workpiece to be processed by the processing apparatus 1, and includes a circular semiconductor wafer, for example. The wafer 100 has a plurality of devices constructed in a face side 101 thereof. The face side 101 of the wafer 100 faces downwardly in FIG. 1 and is protected by a protective tape 103 affixed thereto. The wafer 100 has a reverse side 102, opposite the face side 101, that is to be processed, i.e., ground or polished, by the processing apparatus 1.

A first cassette 150 and a second cassette 151 are disposed in juxtaposed relation on a front side, facing in the −Y direction, of an apparatus base 10 of the processing apparatus 1. The first cassette 150 accommodates a plurality of wafers 100 to be processed, whereas the second cassette 151 accommodates a plurality of wafers 100 that have been processed.

The first cassette 150 and the second cassette 151 have respective openings, not illustrated, defined in respective side walls thereof that face in the +Y direction. The processing apparatus 1 includes a robot 155 mounted on the apparatus base 10 and spaced from the openings of the first cassette 150 and the second cassette 151 in the +Y direction. When the robot 155 is actuated, it loads a processed wafer 100 into the second cassette 151 through the opening thereof and also removes a wafer 100 to be processed from the first cassette 150 through the opening thereof and places the removed wafer 100 temporarily on a temporary rest table 152. On the temporary rest table 152, a positioning process is performed on the temporarily placed wafer 100.

A loading mechanism 154 is mounted on the apparatus base 10 near the temporary rest table 152. The loading mechanism 154 is an example of a delivery mechanism for loading a wafer 100 onto and unloading a wafer 100 from a chuck table 20. The loading mechanism 154 includes a loading pad 154*a* for holding a wafer 100. The loading mechanism 154 holds a wafer 100 positioned on the temporary rest table 152 with the loading pad 154*a*, and swings to deliver the wafer 100 to the chuck table 20, and places the wafer 100 on a holding surface 22 of the chuck table 20.

Figure 2:
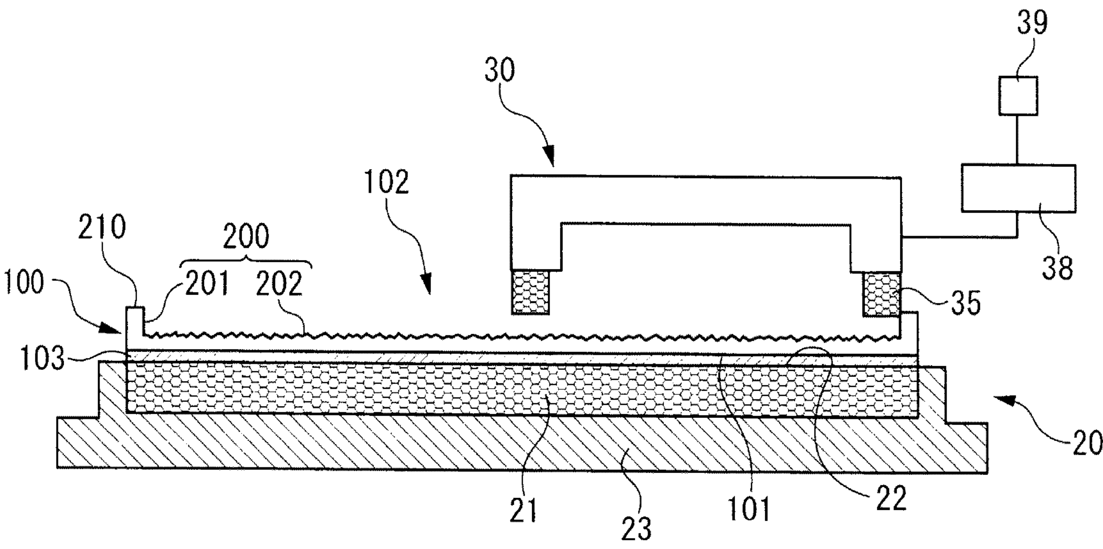
FIG. 2 is a side elevational view, partly in cross section, illustrating a circular recess forming step of a wafer processing method carried out by the processing apparatus illustrated in FIG. 1.

As illustrated in FIG. 2, the chuck table 20 has a frame 23 substantially shaped as a circular plate and having a cavity defined in an upper surface thereof. The chuck table 20 includes a suction holder 21 made of a porous material such as porous ceramic that is disposed in the cavity of the frame 23. The suction holder 21 has an upper surface as the holding surface 22 for holding the wafer 100 under suction. Specifically, the suction holder 21 is fluidly connected to a suction source, not illustrated. When the suction source is actuated, it generates and applies a negative pressure to the suction holder 21, holding the wafer 100 under suction on the holding surface 22.

The chuck table 20 with the wafer 100 held under suction on the holding surface 22 is rotatable by a rotary actuator, not illustrated, about a central table axis that extends along the Z-axis direction through the center of the holding surface 22.

According to the present embodiment, as illustrated in FIG. 1, the processing apparatus 1 includes four chuck tables 20 disposed on an upper surface of a turntable 25 mounted on the apparatus base 10. Each of the chuck tables 20 has the structure illustrated in FIG. 2. The chuck tables 20 are circumferentially spaced at equal intervals around the center of the turntable 25. The turntable 25 is divided into four regions by partition walls 61 disposed thereon. The chuck tables 20 are positioned in the four respective regions of the turntable 25. A shaft, not illustrated, is mounted on the center of the turntable 25 and coupled to a rotary actuator, not illustrated. When the rotary actuator is energized, it turns the shaft and hence the turntable 25 intermittently about its central axis extending along the Z-axis.

When the turntable 25 is intermittently turned about the central axis thereof, the four chuck tables 20 are also intermittently turned about the central axis. When the turntable 25 stops moving, the four chuck tables 20 are positioned respectively in a delivery position 400 near the temporary rest table 152, a first processing position 401 below the first processing mechanism 30, a second processing position 402 below the second processing mechanism 40, and a third processing position 403 below the third processing mechanism 50.

The delivery position 400 refers to a position or area where the loading mechanism 154 can load a wafer 100 onto the chuck table 20 in the delivery position 400 and an unloading mechanism 157 can unload a wafer 100 from the chuck table 20 in the delivery position 400. The loading mechanism 154 delivers a wafer 100 from the temporary rest table 152 to the chuck table 20 in the delivery position 400.

The first processing position 401, the second processing position 402, and the third processing position 403 refer to respective positions or areas where the first processing mechanism 30, the second processing mechanism 40, and the third processing mechanism 50 can process respective wafers 100 on the chuck tables 20 positioned respectively in the first processing position 401, the second processing position 402, and the third processing position 403.

A first column 11 that is of a pentagonal horizontal cross-sectional shape is erected on a rear portion of the apparatus base 10 that is remote in the +Y direction from the front side of the apparatus base 10. The first column 11 has a first front surface 11*a* that supports thereon the first processing mechanism 30 for coarsely grinding a wafer 100, a first vertically moving mechanism 38 for moving the first processing mechanism 30 vertically along the Z-axis, and a first horizontally moving mechanism 39 for moving the first processing mechanism 30 and the first vertically moving mechanism 38 horizontally.

The first processing mechanism 30 has a first annular grinding wheel 35 that can be rotated about its central axis by a rotary actuator, not illustrated. The first annular grinding wheel 35 includes an annular array of grindstones. The grindstones of the first annular grinding wheel 35 are coarse grindstones including relatively large abrasive grains. The abrasive grains of the grindstones of the first annular grinding wheel 35 have a grit size of 300, for example. The first annular grinding wheel 35 is smaller in diameter than the wafer 100 to be ground thereby, for example.

The first processing mechanism 30 grinds the wafer 100 held on the holding surface 22 of the chuck table 20 in the first processing position 401 with the first annular grinding wheel 35, forming a circular recess 200 (see FIG. 2) in a central portion of the wafer 100. The circular recess 200 is defined by a bottom 202 of a circular shape that extends horizontally and an inner side surface 201 of an annular shape that extends vertically around the bottom 202. FIG. 1 illustrates a substantially arcuate processing region R1 where the grindstones of the first annular grinding wheel 35 process the wafer 100. The first annular grinding wheel 35 of the first processing mechanism 30 may alternatively have an annular array of finishing grindstones including relatively small abrasive grains that have a grit size of 2000, for example.

The first horizontally moving mechanism 39 moves the first annular grinding wheel 35 linearly, for example, diametrically across the wafer 100 on the holding surface 22 to adjust the horizontal position of the first annular grinding wheel 35 with respect to the wafer 100.

The first column 11 also has a second front surface 11*b* that supports thereon the second processing mechanism 40 for finishingly grinding a wafer 100, a second vertically moving mechanism 48 for moving the second processing mechanism 40 vertically along the Z-axis, and a second horizontally moving mechanism 49 for moving the second processing mechanism 40 and the second vertically moving mechanism 48 horizontally.

The second processing mechanism 40 has a second annular grinding wheel 45 that can be rotated about its central axis by a rotary actuator, not illustrated. The second annular grinding wheel 45 includes an annular array of grindstones. The grindstones of the second annular grinding wheel 45 are finishing grindstones including relatively small abrasive grains. The second annular grinding wheel 45 is smaller in diameter than the wafer 100 to be ground thereby, for example.

The second annular grinding wheel 45 is smaller in diameter than the first annular grinding wheel 35. The second annular grinding wheel 45 may be of such a size that it grinds the bottom 202 (see FIG. 3) of the circular recess 200 that has been ground by the first annular grinding wheel 35 while being kept out of contact with the inner side surface 201 of the circular recess 200.

The grindstones of the second annular grinding wheel 45 may alternatively be coarse grindstones including relatively large abrasive grains in the second processing mechanism 40.

The second processing mechanism 40 grinds the bottom 202 of the circular recess 200 in the wafer 100 held on the holding surface 22 of the chuck table 20 with the second annular grinding wheel 45. FIG. 1 illustrates a substantially arcuate processing region R2 where the grindstones of the second annular grinding wheel 45 process the wafer 100.

The second horizontally moving mechanism 49 moves the second annular grinding wheel 45 linearly, for example, diametrically across the wafer 100 on the holding surface 22 to adjust the horizontal position of the second annular grinding wheel 45 with respect to the wafer 100.

A second column 12 that is of a trapezoidal horizontal cross-sectional shape is erected on a front portion of the apparatus base 10 that is remote in the −Y direction from the rear portion of the apparatus base 10. The second column 12 has a front surface 12*a* that supports thereon the third processing mechanism 50 for precision-grinding a wafer 100, a third vertically moving mechanism 58 for moving the third processing mechanism 50 vertically along the Z-axis, and a third horizontally moving mechanism 59 for moving the third processing mechanism 50 and the third vertically moving mechanism 58 horizontally.

The third processing mechanism 50 has a third annular grinding wheel 55 that can be rotated about its central axis by a rotary actuator, not illustrated. The third annular grinding wheel 55 includes an annular array of grindstones. The grindstones of the third annular grinding wheel 55 are precision grindstones including small abrasive grains for precision-grinding the wafer 100. The abrasive grains of the grindstones of the third annular grinding wheel 55 have a grit size of 8000, for example. The third annular grinding wheel 55 is smaller in diameter than the wafer 100 to be ground thereby, for example.

The third annular grinding wheel 55 is smaller in diameter than the second annular grinding wheel 45. The third annular grinding wheel 55 may be of such a size that it grinds the bottom 202 of the circular recess 200 (see FIG. 4) that has been ground by the second annular grinding wheel 45 while being kept out of contact with the inner side surface 201 of the circular recess 200.

The third processing mechanism 50 grinds the bottom 202 of the circular recess 200 in the wafer 100 held on the holding surface 22 of the chuck table 20 with the second annular grinding wheel 45. FIG. 1 illustrates a substantially arcuate processing region R3 where the grindstones of the third annular grinding wheel 55 process the wafer 100.

The third horizontally moving mechanism 59 moves the third annular grinding wheel 55 linearly, for example, diametrically across the wafer 100 on the holding surface 22 to adjust the horizontal position of the third annular grinding wheel 55 with respect to the wafer 100.

After the wafer 100 has been processed by the third processing mechanism 50, the chuck table 20 that is holding the wafer 100 thereon is moved to and placed in the delivery position 400. The wafer 100 is then unloaded from the chuck table 20 in the delivery position 400 by the unloading mechanism 157. Specifically, the wafer 100 is held by an unloading pad 157*a* of the unloading mechanism 157 and delivered from the chuck table 20 to a spinner cleaning unit 160. The unloading mechanism 157 is an example of a delivery mechanism for loading a wafer 100 onto and unloading a wafer 100 from a chuck table 20.

The spinner cleaning unit 160 is disposed below the temporary rest table 152. The spinner cleaning unit 160 includes a spinner table 161 for holding the wafer 100 thereon and a cleaning nozzle 162 for ejecting cleaning water and drying air to the wafer 100 on the spinner table 161. While the wafer 100 on the spinner table 161 is being rotated, the cleaning nozzle 162 applies cleaning water to the wafer 100 to clean the wafer 100. After the wafer 100 has been cleaned, the cleaning nozzle 162 applies drying air to the wafer 100 to dry the wafer 100.

The wafer 100 that has been cleaned and dried by the spinner cleaning unit 160 is removed from the spinner cleaning unit 160 by the robot 155 and loaded into the second cassette 151 by the robot 155.

A touch panel 8 is mounted on a side surface of the apparatus base 10 that faces in the −Y direction at a position next to the second cassette 151. The touch panel 8 displays various items of information representing processing conditions for processing wafers 100 on the processing apparatus 1. The touch panel 8 is also used to set various items of information. The touch panel 8 thus functions as a display unit for displaying information and also as an input unit for entering information.

The controller 7 is incorporated in the processing apparatus 1. The controller 7 includes a CPU for performing various arithmetic processing operations according to control programs and a storage medium such as a memory for storing the control programs and various data therein. The controller 7 performs various processing sequences according to the control programs to control various components of the processing apparatus 1.

Now, a wafer processing method carried out on wafers 100 by the processing apparatus 1 under the control of the controller 7 will be described below.

(1-1) Holding Step

For processing wafers 100, the controller 7 controls the robot 155 to remove a wafer 100 to be processed from the first cassette 150 and place the wafer 100 onto the temporary rest table 152, and then performs a positioning process on the wafer 100 on the temporary rest table 152. Then, the controller 7 controls the loading mechanism 154 to hold the wafer 100 on the temporary rest table 152 and places the wafer 100 onto the holding surface 22 of the chuck table 20 in the delivery position 400 such that the reverse side 102 of the wafer 100 faces upwardly. Thereafter, the controller 7 brings the holding surface 22 into fluid communication with the suction source, not illustrated. The controller 7 actuates the suction source, generating and applying a negative pressure to the suction holder 21, holding the wafer 100 under suction on the holding surface 22 with the protective tape 103 interposed therebetween (see FIG. 2). The wafer 100 is thus securely held on the chuck table 20 in the delivery position 400.

(1-2) Circular Recess Forming Step

After the holding step, the controller 7 turns the turntable 25 about its central axis to place the chuck table 20 that is holding the wafer 100 thereon into the first processing position 401 below the first processing mechanism 30.

Then, the controller 7 controls the first horizontally moving mechanism 39 to adjust the horizontal position of the first annular grinding wheel 35 of the first processing mechanism 30 for thereby positioning the outer edge of the first annular grinding wheel 35 radially inwardly of the outer edge of the wafer 100. In this step, coarse grindstones are used as the grindstones of the first annular grinding wheel 35, for example.

Then, the controller 7 rotates the first annular grinding wheel 35 about its central axis and also rotates the chuck table 20 about its central axis. Furthermore, the controller 7 controls the first vertically moving mechanism 38 to lower the first processing mechanism 30 along the Z-axis.

As illustrated in FIG. 2, the first annular grinding wheel 35 that is rotating is brought into abrasive contact with the reverse side 102 of the wafer 100 on the rotating chuck table 20, coarsely grinding the reverse side 102.

Since the outer edge of the first annular grinding wheel 35 is positioned radially inwardly of the outer edge of the wafer 100, the first annular grinding wheel 35 grinds a central portion of the reverse side 102 of the wafer 100. As a result, as illustrated in FIG. 2, the circular recess 200 defined by the bottom 202 and the inner side surface 201 is formed in the central portion of the reverse side 102 of the wafer 100, leaving an annular land 210 extending around the circular recess 200 and surrounding the circular recess 200.

As the coarse grindstones are used as the grindstones of the first annular grinding wheel 35 to grind the wafer 100 in the circular recess forming step, the coarsely ground bottom 202 of the circular recess 200 has a rough surface with relatively large surface irregularities.

While the wafer 100 is being ground by the first annular grinding wheel 35, the controller 7 may measure the thickness of the bottom 202 of the circular recess 200 with a thickness measuring instrument, not illustrated. The controller 7 continues to coarsely grind the wafer 100 with the first annular grinding wheel 35 until the measured thickness of the bottom 202 reaches a predetermined coarsely ground thickness.

(1-3) Finishingly Grinding Step

In a finishingly grinding step, the controller 7 finishingly grinds the bottom 202 of the circular recess 200 of the wafer 100. Specifically, the controller 7 turns the turntable 25 about its central axis to place the chuck table 20 that is holding thereon the wafer 100 with the coarsely ground central circular recess 200 into the second processing position 402 below the second processing mechanism 40.

Then, the controller 7 controls the second horizontally moving mechanism 49 to adjust the horizontal position of the second annular grinding wheel 45 of the second processing mechanism 40 for thereby positioning the outer edge of the second annular grinding wheel 45 radially inwardly of the outer edge of the wafer 100 in the same manner as positioning the outer edge of the first annular grinding wheel 35 in the circular recess forming step. Specifically, the second annular grinding wheel 45 is positioned such that the outer edge thereof is kept out of contact with the inner side surface 201 of the circular recess 200. In this step, finishing grindstones are used as the grindstones of the second annular grinding wheel 45, for example.

Then, as in the circular recess forming step, the controller 7 rotates the second annular grinding wheel 45 about its central axis and also rotates the chuck table 20 about its central axis. Further, the controller 7 controls the second vertically moving mechanism 48 to lower the second processing mechanism 40 along the Z-axis.

Figure 3:
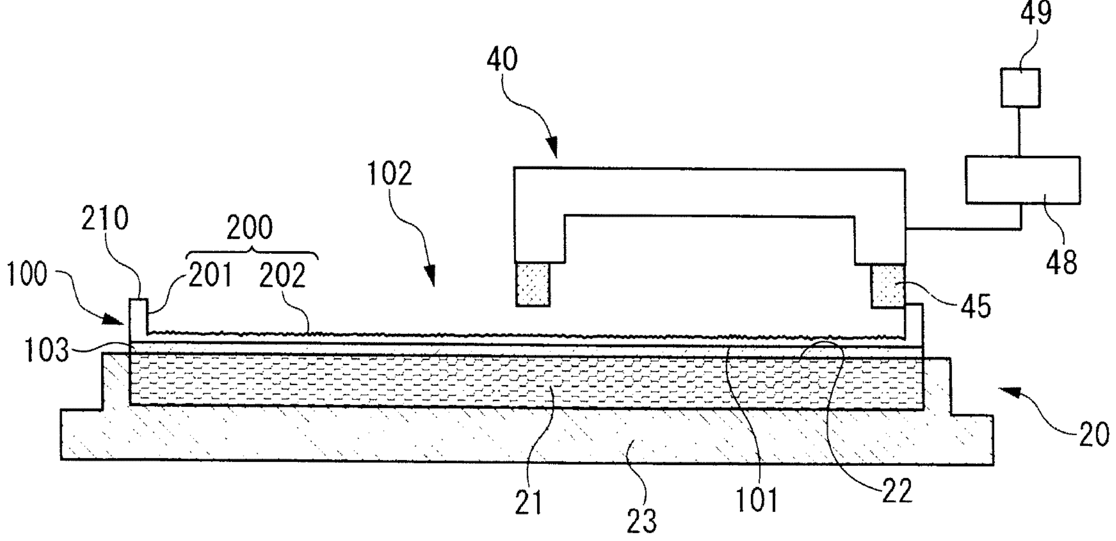
FIG. 3 is a side elevational view, partly in cross section, illustrating a finishingly grinding step of the wafer processing method carried out by the processing apparatus illustrated in FIG. 1.

As illustrated in FIG. 3, the second annular grinding wheel 45 that is rotating is brought into abrasive contact with the bottom 202 of the circular recess 200 in the central portion of the reverse side 102 of the wafer 100 on the rotating chuck table 20, finishingly grinding the bottom 202 of the circular recess 200.

As the finishing grindstones are used as the grindstones of the second annular grinding wheel 45 to grind the wafer 100 in the finishingly grinding step, the finishingly ground bottom 202 of the circular recess 200 has a relatively smooth surface with relatively small surface irregularities.

While the wafer 100 is being ground by the second annular grinding wheel 45, the controller 7 may measure the thickness of the bottom 202 of the circular recess 200 with a thickness measuring instrument, not illustrated. The controller 7 continues to finishingly grind the wafer 100 with the second annular grinding wheel 45 until the measured thickness of the bottom 202 reaches a predetermined finishingly ground thickness.

(1-4) Precision-Grinding Step

In a precision-grinding step, the controller 7 precision-grinds the bottom 202 of the circular recess 200 in the wafer 100. In this step, the controller 7 turns the turntable 25 about its central axis to place the chuck table 20 that is holding thereon the wafer 100 with the finishingly ground central circular recess 200 into the third processing position 403 below the third processing mechanism 50.

Then, the controller 7 controls the third horizontally moving mechanism 59 to adjust the horizontal position of the third annular grinding wheel 55 of the third processing mechanism 50 for thereby positioning the outer edge of the third annular grinding wheel 55 radially inwardly of the outer edge of the wafer 100 in the same manner as positioning the outer edge of the second annular grinding wheel 45 in the finishingly grinding step. Specifically, the third annular grinding wheel 55 is positioned such that the outer edge thereof is kept out of contact with the inner side surface 201 of the circular recess 200.

Then, the controller 7 rotates the third annular grinding wheel 55 about its central axis and also rotates the chuck table 20 about its central axis. Further, the controller 7 controls the third vertically moving mechanism 58 to lower the third processing mechanism 50 along the Z-axis.

Figure 4:
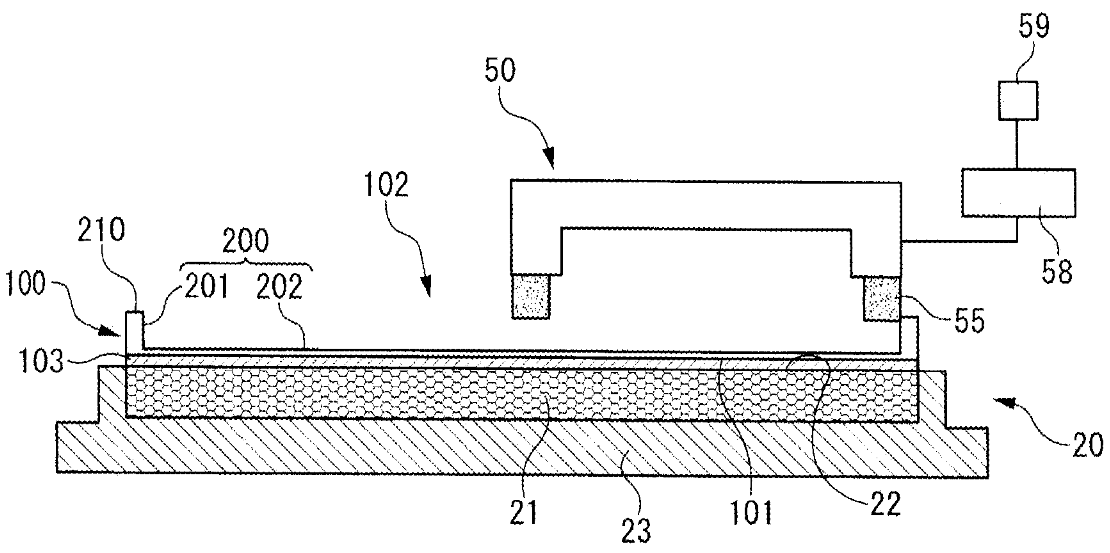
FIG. 4 is a side elevational view, partly in cross section, illustrating a precision-grinding step of the wafer processing method carried out by the processing apparatus illustrated in FIG. 1.

As illustrated in FIG. 4, the third annular grinding wheel 55 that is rotating is brought into abrasive contact with the bottom 202 of the circular recess 200 in the central portion of the reverse side 102 of the wafer 100 on the rotating chuck table 20, precision-grinding the bottom 202 of the circular recess 200.

As the precision grindstones are used as the grindstones of the third annular grinding wheel 55 to grind the wafer 100 in the precision-grinding step, the precision-ground bottom 202 of the circular recess 200 has a highly smooth surface similar to a mirror finish.

While the wafer 100 is being ground by the third annular grinding wheel 55, the controller 7 may measure the thickness of the bottom 202 of the circular recess 200 with a thickness measuring instrument, not illustrated. The controller 7 continues to precision-grind the wafer 100 with the third annular grinding wheel 55 until the measured thickness of the bottom 202 reaches a predetermined precision-ground thickness.

(1-5) Cleaning and Retrieving Step

After having completed the precision-grinding step, the controller 7 turns the turntable 25 about its central axis to place the chuck table 20 that is holding thereon the wafer 100 having been precision-ground into the delivery position 400. Then, the controller 7 controls the unloading mechanism 157 to deliver the wafer 100 to the spinner cleaning unit 160, and controls the spinner cleaning unit 160 to clean the wafer 100. After the wafer 100 has been cleaned, the controller 7 controls the robot 155 to remove the cleaned wafer 100 from the spinner cleaning unit 160 and load the wafer 100 into the second cassette 151.

According to the present embodiment, as described above, the four chuck tables 20 are disposed on the turntable 25. The turntable 25 is intermittently turned about its central axis to place the wafer 100 held on each of the chuck tables 20 successively in the first processing position 401 below the first annular grinding wheel 35, the second processing position 402 below the second annular grinding wheel 45, and the third processing position 403 below the third annular grinding wheel 55. In the first processing position 401, the second processing position 402, and the third processing position 403, the reverse side 102 of the wafer 100 is processed respectively by three different types of grinding processes, i.e., a coarsely grinding process that coarsely grinds the reverse side 102 with the first annular grinding wheel 35 to form the circular recess 200 in the central portion thereof, a finishingly grinding process that finishingly grinds the bottom 202 of the circular recess 200 with the second annular grinding wheel 45, and a precision-grinding process that prevision-grinds the bottom 202 of the circular recess 200 with the third annular grinding wheel 55.

Consequently, the coarsely grinding process, the finishingly grinding process, and the precision-grinding process can be performed on the wafer 100 without the wafer 100 being spaced from the holding surface 22 of the chuck table 20, i.e., while the wafer 100 is staying in contact with the holding surface 22 of the chuck table 20. The wafer 100 is thus prevented from being shifted in position on the holding surface 22, i.e., from changing the manner in which the wafer 100 is held on the holding surface 22, in the coarsely grinding process, the finishingly grinding process, and the precision-grinding process. In the finishingly grinding process and the precision-grinding process after the coarsely grinding process, the second annular grinding wheel 45 and the third annular grinding wheel 55 as processing tools are therefore kept in an appropriate processing position with respect to the bottom 202. Accordingly, the bottom 202 of the circular recess 200 can be finishingly ground and precision-ground without causing damage to the circular recess 200 and the annular land 210 that have been initially formed by the first annular grinding wheel 35.

According to the present embodiment, moreover, the first horizontally moving mechanism 39, the second horizontally moving mechanism 49, and the third horizontally moving mechanism 59 adjust the horizontal position of the first annular grinding wheel 35, the second annular grinding wheel 45, and the third annular grinding wheel 55, respectively. Therefore, the first annular grinding wheel 35, the second annular grinding wheel 45, and the third annular grinding wheel 55 can be kept more accurately in an appropriate processing position with respect to the bottom 202.

Figure 5:
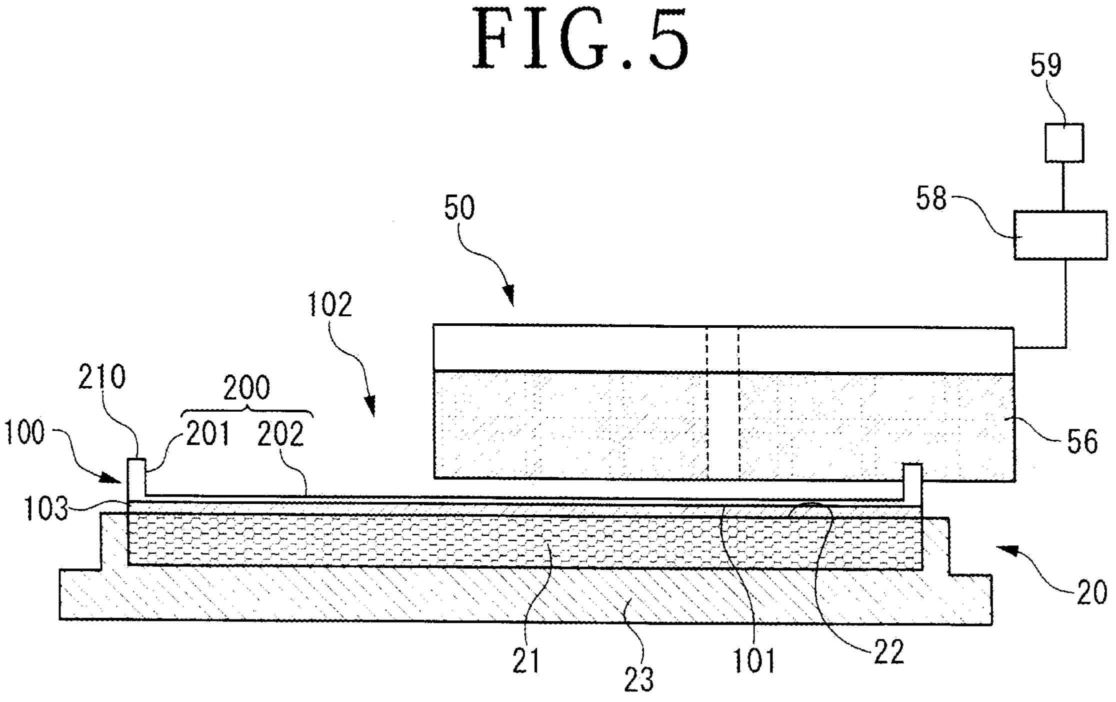
FIG. 5 is a side elevational view, partly in cross section, illustrating a first polishing step of the wafer processing method carried out by the processing apparatus illustrated in FIG. 1.

The third processing mechanism 50 may have a first polishing pad 56 illustrated in FIG. 5 rather than the third annular grinding wheel 55. The first polishing pad 56 can be rotated about its central axis by a rotary actuator, not illustrated, and has a diameter larger than the radius of the wafer 100, for example. The third processing mechanism 50 having the first polishing pad 56 polishes the reverse side 102 of the wafer 100 with the first polishing pad 56. The third horizontally moving mechanism 59 moves the first polishing pad 56 linearly, for example, diametrically across the wafer 100 on the holding surface 22 to adjust the horizontal position of the first polishing pad 56 with respect to the wafer 100.

In case the third processing mechanism 50 has the first polishing pad 56 rather than the third annular grinding wheel 55, the third processing mechanism 50 operates to carry out a first polishing step rather than the precision-grinding step, after the finishingly grinding step. In the first polishing step, the first polishing pad 56 polishes the upper surface of the wafer 100, i.e., the inner side surface 201 and the bottom 202 of the circular recess 200 in the wafer 100 and the upper surface of the annular land 210.

In the first polishing step after the finishingly polishing step, the controller 7 turns the turntable 25 about its central axis to place the chuck table 20 that is holding thereon the wafer 100 having been finishingly ground into the third processing position 403 below the third processing mechanism 50.

Then, the controller 7 controls the third horizontally moving mechanism 59 to adjust the horizontal position of the first polishing pad 56 of the third processing mechanism 50 for thereby placing the first polishing pad 56 in a position capable of polishing the inner side surface 201 and the bottom 202 of the circular recess 200 in the wafer 100 and the upper surface of the annular land 210, as illustrated in FIG. 5.

Then, the controller 7 rotates the first polishing pad 56 of the third processing mechanism 50 about its central axis and also rotates the chuck table 20 about its central axis. Further, the controller 7 controls the third vertically moving mechanism 58 to lower the third processing mechanism 50 along the Z-axis.

The first polishing pad 56 that is rotating is brought into contact with the inner side surface 201 and the bottom 202 of the circular recess 200 in the wafer 100 on the rotating chuck table 20 and the upper surface of the annular land 210 thereof. The first polishing pad 56 now polishes each of the bottom 202 and the inner side surface 201 of the circular recess 200, and the upper surface of the annular land 210 to a highly smooth surface similar to a mirror finish. Since the first polishing pad 56 is elastically deformable, when it is pressed against the wafer 100 from above, it can fully contact the entire upper surface of the wafer 100 that has irregularities, i.e., the bottom 202 and the inner side surface 201 of the circular recess 200, and the upper surface of the annular land 210.

The inner side surface 201 of the circular recess 200 may not be an annular vertical surface extending along the Z-axis, but may be an annular slanted surface that is progressively smaller in diameter downwardly, i.e., that has a larger diameter at the upper end of the circular recess 200 and smaller diameter at the lower end of the circular recess 200. The first polishing pad 56 may polish the inner side surface 201 that is slanted as described above when the first polishing pad 56 is pressed against the wafer 100 from above.

While the wafer 100 is being polished by the first polishing pad 56, the controller 7 may measure the thickness of the bottom 202 with a thickness measuring instrument, not illustrated. The controller 7 continues to polish the wafer 100 with the first polishing pad 56 until the measured thickness of the bottom 202 reaches a predetermined polished thickness.

On the basis of the thickness of the bottom 202 as measured by the thickness measuring instrument, the controller 7 may detect surface irregularities caused by grinding marks left on the upper surface of the bottom 202, and may continuously polish the bottom 202 with the first polishing pad 56 until the detected surface irregularities are eliminated.

With the arrangement including the first polishing pad 56, the coarsely grinding process, the finishingly grinding process, and the polishing process can be performed on the wafer 100 without the wafer 100 being spaced from the holding surface 22 of the chuck table 20, i.e., while the wafer 100 is staying in contact with the holding surface 22 of the chuck table 20. In the finishingly grinding process and the polishing process after the coarsely grinding process, the second annular grinding wheel 45 and the first polishing pad 56 as processing tools are kept in an appropriate processing position with respect to the wafer 100. Accordingly, the wafer 100 can be finishingly ground and polished without causing damage to the circular recess 200 and the annular land 210 that have been initially formed by the first annular grinding wheel 35.

According to the present embodiment, as illustrated in FIG. 1, the processing apparatus 1 may include a fourth processing mechanism 60 rather than the first processing mechanism 30.

Providing the processing apparatus 1 includes the fourth processing mechanism 60 rather than the first processing mechanism 30, the first processing position 401 is a position below the fourth processing mechanism 60, where the fourth processing mechanism 60 can process a wafer 100 on a chuck table 20 in the first processing position 401. When the turntable 25 is intermittently turned about the central axis thereof, the four chuck tables 20 are also intermittently turned about the central axis and positioned respectively in the delivery position 400, the first processing position 401, the second processing position 402, and the third processing position 403 when the turntable 25 stops moving.

The first front surface 11*a* of the first column 11 supports thereon the fourth processing mechanism 60, a fourth vertically moving mechanism 68 for moving the fourth processing mechanism 60 vertically along the Z-axis, and a fourth horizontally moving mechanism 69 for moving the fourth processing mechanism 60 and the fourth vertically moving mechanism 68 horizontally, instead of the first processing mechanism 30, the first vertically moving mechanism 38, and the first horizontally moving mechanism 39.

The fourth processing mechanism 60 has a fourth annular grinding wheel, i.e., an upper surface grinding wheel, 65 that can be rotated about its central axis by a rotary actuator, not illustrated. The fourth annular grinding wheel 65 includes an annular array of grindstones. The grindstones of the fourth annular grinding wheel 65 are the coarse grindstones, the finishing grindstones, or the precision grindstones referred to above. The fourth annular grinding wheel 65 has a diameter larger than the width of the annular land 210 formed on the wafer 100, for example. The diameter of the fourth annular grinding wheel 65 may be smaller than the diameter of the wafer 100 or equal to or larger than the diameter of the wafer 100, for example.

The fourth processing mechanism 60 grinds at least a portion, to be made into the annular land 210, of the reverse side 102 of the wafer 100 held on the holding surface 22 of the chuck table 20 with the fourth annular grinding wheel 65.

The fourth vertically moving mechanism 68 moves the fourth processing mechanism 60 along the Z-axis. The fourth horizontally moving mechanism 69 moves the fourth annular grinding wheel 65 linearly, for example, diametrically across the wafer 100 on the holding surface 22 to adjust the horizontal position of the fourth annular grinding wheel 65 with respect to the wafer 100.

Now, a wafer processing method carried out on wafers 100 by the processing apparatus 1 incorporating the fourth processing mechanism 60 under the control of the controller 7 will be described below.

(2-1) Holding Step

The controller 7 carries out the holding step referred to above to hold a wafer 100 on the chuck table 20 in the delivery position 400.

(2-2) Outer Circumferential Portion Grinding Step

Then, the controller 7 turns the turntable 25 about its central axis to place the chuck table 20 that is holding the wafer 100 thereon into the first processing position 401 below the fourth processing mechanism 60.

The controller 7 controls the fourth horizontally moving mechanism 69 to adjust the horizontal position of the fourth annular grinding wheel 65 of the fourth processing mechanism 60 for thereby positioning the fourth annular grinding wheel 65 in a position capable of grinding an outer circumferential portion of the wafer 100.

Then, the controller 7 rotates the fourth annular grinding wheel 65 of the fourth processing mechanism 60 and also rotates the chuck table 20 about its central axis. Further, the controller 7 controls the fourth vertically moving mechanism 68 to lower the fourth processing mechanism 60 along the Z-axis.

Figure 6:
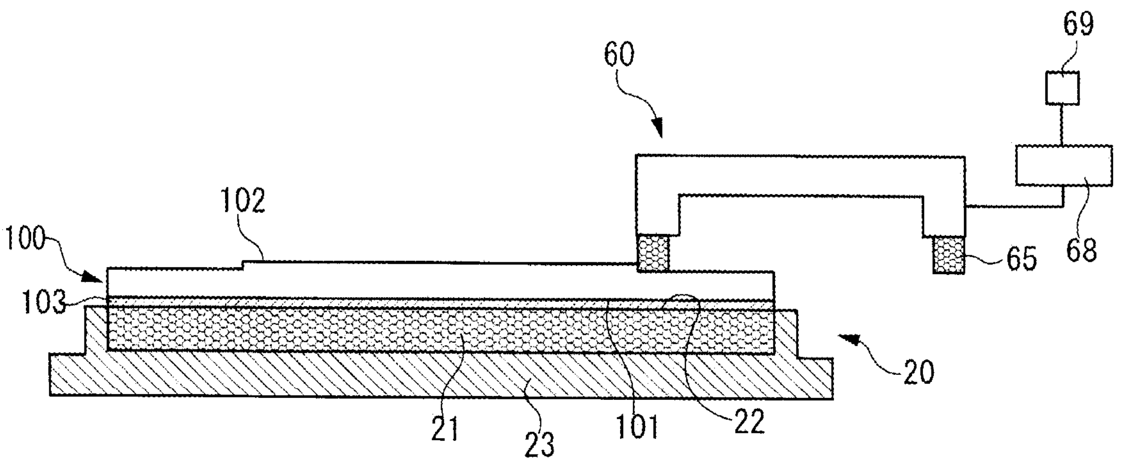
FIG. 6 is a side elevational view, partly in cross section, illustrating an outer circumferential portion grinding step of the wafer processing method carried out by the processing apparatus illustrated in FIG. 1.

As illustrated in FIG. 6, the fourth annular grinding wheel 65 that is rotating is brought into abrasive contact with the reverse side 102 of the wafer 100 on the rotating chuck table 20, grinding a portion of the reverse side 102 that includes an outer circumferential portion to be subsequently made into the annular land 210.

While the wafer 100 is being ground by the fourth annular grinding wheel 65, the controller 7 may measure the thickness of the portion being ground by the fourth annular grinding wheel 65 with a thickness measuring instrument, not illustrated. The controller 7 continues to grind the wafer 100 with the fourth annular grinding wheel 65 until the measured thickness reaches a predetermined thickness.

(2-3) Circular Recess Forming Step

After the outer circumferential portion grinding step, the controller 7 turns the turntable 25 about its central axis to place the chuck table 20 that is holding the wafer 100 with the ground outer circumferential portion thereon into the second processing position 402 below the second processing mechanism 40.

Then, the controller 7 controls the second horizontally moving mechanism 49 to adjust the horizontal position of the second annular grinding wheel 45 of the second processing mechanism 40 for thereby positioning the outer edge of the second annular grinding wheel 45 radially inwardly of the outer edge of the wafer 100.

Then, the controller 7 rotates the second annular grinding wheel 45 about its central axis and also rotates the chuck table 20 about its central axis. Further, the controller 7 controls the second vertically moving mechanism 48 to lower the second processing mechanism 40 along the Z-axis.

The second annular grinding wheel 45 that is rotating is brought into abrasive contact with the reverse side 102 of the wafer 100 on the rotating chuck table 20, grinding the reverse side 102.

Since the outer edge of the second annular grinding wheel 45 is positioned radially inwardly of the outer edge of the wafer 100, the second annular grinding wheel 45 grinds a central portion of the reverse side 102 of the wafer 100. As a result, as illustrated in FIG. 3, the circular recess 200 defined by the bottom 202 and the inner side surface 201 is formed in the central portion of the reverse side 102 of the wafer 100, leaving the annular land 210 extending around the circular recess 200 and surrounding the circular recess 200.

While the wafer 100 is being ground by the second annular grinding wheel 45, the controller 7 may measure the thickness of the bottom 202 of the circular recess 200 with a thickness measuring instrument, not illustrated. The controller 7 continues to grind the wafer 100 with the second annular grinding wheel 45 until the measured thickness of the bottom 202 reaches a predetermined coarsely or finishingly ground thickness. In this step, the second annular grinding wheel 45 may include the coarse grindstones or the finishing grindstones referred to above.

(2-4) Precision-Grinding Step

This step is similar to the precision-grinding step that is carried out using the third processing mechanism 50 described above. Specifically, the controller 7 places the chuck table 20 that is holding thereon the wafer 100 with the circular recess 200 formed therein into the third processing position 403 below the third processing mechanism 50.

Then, the controller 7 controls the third horizontally moving mechanism 59 to adjust the horizontal position of the third annular grinding wheel 55 of the third processing mechanism 50 for thereby positioning the outer edge of the third annular grinding wheel 55 radially inwardly of the outer edge of the wafer 100 in the same manner as positioning the outer edge of the second annular grinding wheel 45 in the circular recess forming step. Specifically, the third annular grinding wheel 55 is positioned such that the outer edge thereof is kept out of contact with the inner side surface 201 of the circular recess 200.

Then, the controller 7 rotates the third annular grinding wheel 55 about its central axis and also rotates the chuck table 20 about its central axis. Further, the controller 7 controls the third vertically moving mechanism 58 to lower the third processing mechanism 50 along the Z-axis.

As illustrated in FIG. 4, the third annular grinding wheel 55 that is rotating is brought into abrasive contact with the bottom 202 of the circular recess 200 in the central portion of the reverse side 102 of the wafer 100 on the rotating chuck table 20, precision-grinding the bottom 202 of the circular recess 200.

As the precision grindstones are used as the grindstones of the third annular grinding wheel 55 to grind the wafer 100 in the precision-grinding step, the precision-ground bottom 202 of the circular recess 200 has a highly smooth surface similar to a mirror finish.

While the wafer 100 is being ground by the third annular grinding wheel 55, the controller 7 may measure the thickness of the bottom 202 of the circular recess 200 with a thickness measuring instrument, not illustrated. The controller 7 continues to precision-grind the wafer 100 with the third annular grinding wheel 55 until the measured thickness of the bottom 202 reaches a predetermined precision-ground thickness.

(2-5) Cleaning and Retrieving Step

After having completed the precision-grinding step, the controller 7 turns the turntable 25 illustrated in FIG. 1 about its central axis to place the chuck table 20 that is holding thereon the wafer 100 having been precision-ground into the delivery position 400. Then, the controller 7 controls the unloading mechanism 157 to deliver the wafer 100 to the spinner cleaning unit 160, and controls the spinner cleaning unit 160 to clean the wafer 100. After the wafer 100 has been cleaned, the controller 7 controls the robot 155 to remove the cleaned wafer 100 from the spinner cleaning unit 160 and load the wafer 100 into the second cassette 151.

The processing apparatus 1 incorporating the fourth processing mechanism 60 can perform the outer circumferential portion grinding process, circular recess forming step, and the precision-grinding process on the wafer 100 without the wafer 100 being spaced from the holding surface 22 of the chuck table 20, i.e., while the wafer 100 is staying in contact with the holding surface 22 of the chuck table 20. In the circular recess forming step and the precision-grinding process after the outer circumferential portion grinding process, the second annular grinding wheel 45 and the third annular grinding wheel 55 as processing tools are therefore kept in an appropriate processing position with respect to the bottom 202. Accordingly, the bottom 202 of the circular recess 200 can be precision-ground without causing damage to the circular recess 200 and the annular land 210 that have been initially formed by the second annular grinding wheel 45.

In the outer circumferential portion grinding step, the controller 7 controls the fourth annular grinding wheel 65 of the fourth processing mechanism 60 to grind a portion of the reverse side 102 that includes an outer circumferential portion to be subsequently made into the annular land 210, as illustrated in FIG. 6. When the annular ground portion of the reverse side 102 is subsequently made into the annular land 210, the annular land 210 can be uniform in thickness.

In the outer circumferential portion grinding step, further, at least the portion, to be subsequently made into the annular land 210, of the upper surface of the wafer 100 is ground. The controller 7 may control the fourth annular grinding wheel 65 to grind the entire reverse side 102 of the wafer 100 in the outer circumferential portion grinding step. The fourth annular grinding wheel 65 may thus be a full-surface grinding wheel having a diameter larger than the radius of the wafer 100.

If the second annular grinding wheel 45 includes coarse grindstones, for example, then the third annular grinding wheel 55 of the third processing mechanism 50 may include the finishing grindstones described above. In this case, as the third processing mechanism 50 finishingly grinds the bottom 202 of the circular recess 200 in the wafer 100, the finishingly ground bottom 202 has a relatively smooth surface.

The third processing mechanism 50 may have the first polishing pad 56 described above with reference to FIG. 5 rather than the third annular grinding wheel 55. In this case, the third processing mechanism 50 polishes the reverse side 102 as the upper surface of the wafer 100 with the first polishing pad 56. The third horizontally moving mechanism 59 moves the first polishing pad 56 linearly, for example, diametrically across the wafer 100 on the holding surface 22 to adjust the horizontal position of the first polishing pad 56 with respect to the wafer 100.

In this case, after the circular recess forming step, the third processing mechanism 50 carries out the first polishing step rather than the precision-grinding step, polishing the upper surface of the wafer 100, i.e., the inner side surface 201 and the bottom 202 of the circular recess 200 in the wafer 100 and the upper surface of the annular land 210 thereof.

In this step, after the circular recess forming step, the controller 7 turns the turntable 25 about its central axis to place the chuck table 20 that is holding thereon the wafer 100 with the circular recess 200 formed therein into the third processing position 403 below the third processing mechanism 50.

Then, the controller 7 controls the third horizontally moving mechanism 59 to adjust the horizontal position of the first polishing pad 56 of the third processing mechanism 50 for thereby positioning the first polishing pad 56 in the position capable of polishing the circular recess 200 and the annular land 210 of the wafer 100 on the chuck table 20, as illustrated in FIG. 5.

Then, the controller 7 rotates the first polishing pad 56 about its central axis and also rotates the chuck table 20 about its central axis. Further, the controller 7 controls the third vertically moving mechanism 58 to lower the third processing mechanism 50 along the Z-axis.

The first polishing pad 56 that is rotating is brought into contact with the inner side surface 201 and the bottom 202 of the circular recess 200 in the wafer 100 on the rotating chuck table 20 and the upper surface of the annular land 210 thereof. The first polishing pad 56 now polishes each of the bottom 202, the inner side surface 201, and the upper surface of the annular land 210 to a highly smooth surface similar to a mirror finish.

Figure 7:
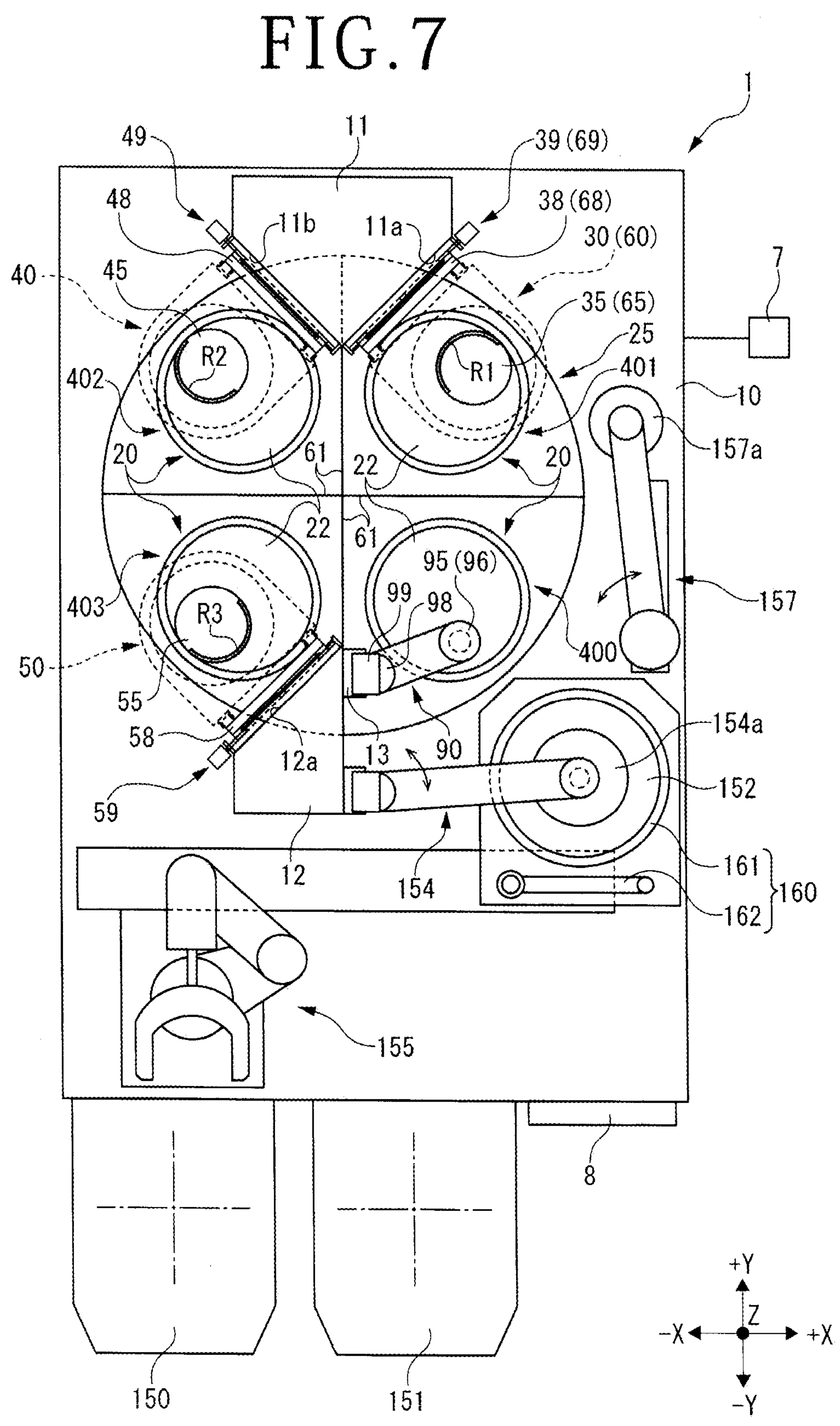
FIG. 7 is a top plan view illustrating structural details of a processing apparatus according to another embodiment of the present invention.

FIG. 7 illustrates in plan a processing apparatus 1 according to another embodiment of the present invention. As illustrated in FIG. 7, the processing apparatus 1 includes a fifth processing mechanism 90 functioning as a polishing mechanism having a second polishing pad 95 for polishing the reverse side 102 of a wafer 100 held on the chuck table 20 that is positioned in the delivery position 400 to which the wafer 100 has been delivered by the unloading mechanism 157. The second polishing pad 95 can be rotated about its central axis by a rotary actuator, not illustrated, and is smaller in diameter than the first polishing pad 56 (see FIG. 5), for example.

The processing apparatus 1 includes a third column 13 erected on the apparatus base 10 near the delivery position 400. The third column 13 supports thereon the fifth processing mechanism 90 having the second polishing pad 95, a fifth vertically moving mechanism 98 for moving the fifth processing mechanism 90 vertically along the Z-axis, and a fifth horizontally moving mechanism 99 for moving the fifth processing mechanism 90 and the fifth vertically moving mechanism 98 horizontally. The fifth horizontally moving mechanism 99 moves the second polishing pad 95 with respect to the wafer 100 held on the holding surface 22 to adjust the horizontal position of the second polishing pad 95 with respect to the wafer 100. The fifth horizontally moving mechanism 99 may horizontally move the second polishing pad 95 either linearly or angularly.

Other details of the processing apparatus 1 illustrated in FIG. 7 are similar to those of the processing apparatus 1 illustrated in FIG. 1.

The fifth processing mechanism 90 operates as follows: After the precision-grinding step or the first polishing step in the third processing position 403, the controller 7 carries out a second polishing step. Specifically, the controller 7 turns the turntable 25 about its central axis to place the chuck table 20 that is holding thereon the wafer 100 processed in the precision-grinding step or the first polishing step into the delivery position 400.

Figure 8:
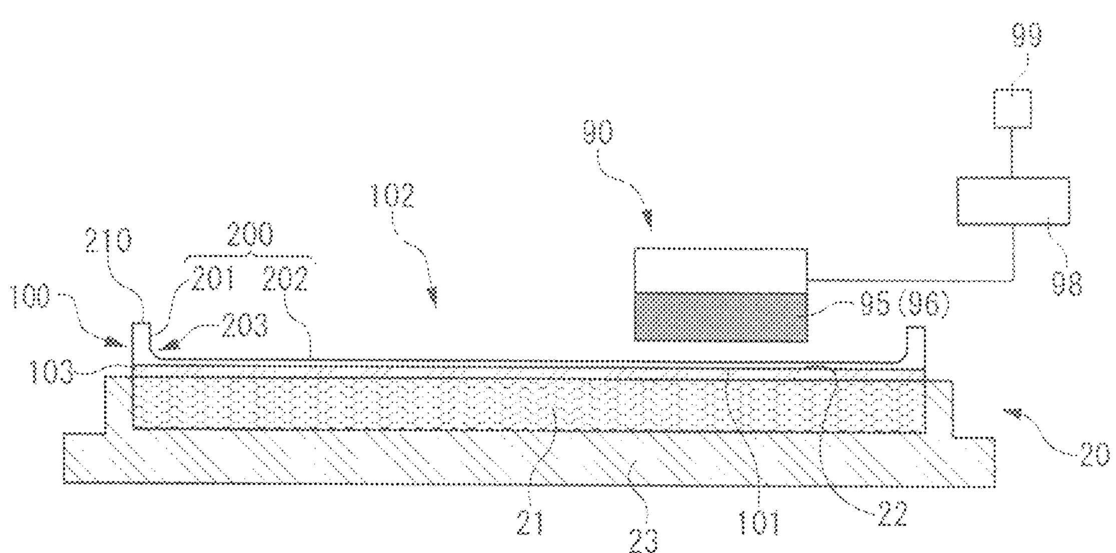
FIG. 8 is a side elevational view, partly in cross section, illustrating a second polishing step of a wafer processing method carried out by the processing apparatus illustrated in FIG. 7.

Then, the controller 7 controls the fifth horizontally moving mechanism 99 to adjust the horizontal position of the second polishing pad 95 of the fifth processing mechanism 90 for thereby placing the second polishing pad 95 into a position capable of polishing at least either one of the inner side surface 201 and the bottom 202 of the circular recess 200 in the wafer 100 on the chuck table 20 and the annular land 210 thereof, as illustrated in FIG. 8.

Then, the controller 7 rotates the second polishing pad 95 of the fifth processing mechanism 90 and also rotates the chuck table 20. Furthermore, the controller 7 controls the fifth vertically moving mechanism 98 to lower the fifth processing mechanism 90 along the Z-axis.

The second polishing pad 95 that is rotating is brought into contact with the at least either one of the inner side surface 201 and the bottom 202 of the circular recess 200 in the wafer 100 on the chuck table 20 that is rotating and the annular land 210 thereof. The at least either one of the inner side surface 201, the bottom 202, and the annular land 210 is thus polished to a highly smooth surface similar to a mirror finish.

The controller 7 may control the second polishing pad 95 to polish or round the corner between the inner side surface 201 and the bottom 202 of the circular recess 200 into an arcuate surface 203, as illustrated in FIG. 8. The arcuate surface 203 is effective to increase the flexural strength of the processed wafer 100.

Then, the controller 7 controls the unloading mechanism 157 (see FIG. 7) to deliver the wafer 100 to the spinner cleaning unit 160, and controls the spinner cleaning unit 160 to clean the wafer 100. After the wafer 100 has been cleaned, the controller 7 controls the robot 155 to remove the cleaned wafer 100 from the spinner cleaning unit 160 and load the wafer 100 into the second cassette 151.

As illustrated in FIG. 7, the fifth processing mechanism 90 may have an outer circumferential upper surface grinding wheel 96 for grinding a portion of the wafer 100 that is to be made into the annular land 210, rather than the second polishing pad 95. The outer circumferential upper surface grinding wheel 96 is particularly useful if the processing apparatus 1 includes the first processing mechanism 30, i.e., does not include the fourth processing mechanism 60.

The outer circumferential upper surface grinding wheel 96 can be rotated about its central axis by a rotary actuator, not illustrated, and has a diameter larger than the width of the annular land 210 formed on the wafer 100, for example. The outer circumferential upper surface grinding wheel 96 includes grindstones that are the coarse grindstones, the finishing grindstones, or the precision grindstones referred to above.

The fifth processing mechanism 90 functions as an outer circumferential upper surface grinding mechanism for grinding at least a portion of, to be made into the annular land 210, of the reverse side 102 of the wafer 100 held on the holding surface 22 of the chuck table 20 in the delivery position 400, with the outer circumferential upper surface grinding wheel 96. The fifth horizontally moving mechanism 99 moves the outer circumferential upper surface grinding wheel 96 with respect to the wafer 100 held on the holding surface 22 to adjust the horizontal position of the outer circumferential upper surface grinding wheel 96 with respect to the wafer 100.

The fifth processing mechanism 90 that has the outer circumferential upper surface grinding wheel 96 operates as follows: After the wafer 100 has been held on the chuck table 20 in the delivery position 400 in the (1-1) holding step described above, the controller 7 controls the fifth horizontally moving mechanism 99 to adjust the horizontal position of the outer circumferential upper surface grinding wheel 96 of the fifth processing mechanism 90 for thereby placing the outer circumferential upper surface grinding wheel 96 into a horizontal position capable of grinding the outer circumferential portion of the wafer 100 held on the chuck table 20.

Then, the controller 7 rotates the outer circumferential upper surface grinding wheel 96 and also rotates the chuck table 20. Further, the controller 7 controls the fifth vertically moving mechanism 98 to lower the fifth processing mechanism 90 along the Z-axis.

The outer circumferential upper surface grinding wheel 96 that is rotating is brought into abrasive contact with the reverse side 102 of the wafer 100 on the rotating chuck table 20 that is rotating, grinding a portion, to be subsequently made into the annular land 210, of the reverse side 102 of the wafer 100.

While the wafer 100 is being ground by the outer circumferential upper surface grinding wheel 96, the controller 7 may measure the thickness of the portion being ground by the outer circumferential upper surface grinding wheel 96 with a thickness measuring instrument, not illustrated. The controller 7 continues to grind the wafer 100 with the outer circumferential upper surface grinding wheel 96 until the measured thickness reaches a predetermined thickness.

Thereafter, the controller 7 carries out the circular recess forming step, the finishingly grinding step, the precision-grinding step, and the cleaning and retrieving step referred to above on the wafer 100.

The outer circumferential upper surface grinding wheel 96 grinds the upper surface of the portion, to be subsequently made into the annular land 210, of the reverse side 102 of the wafer 100 that has not been ground and has been delivered to the chuck table 20 in the delivery position 400 by the loading mechanism 154, forming an annular ground surface on the reverse side 102 that is the upper surface of the wafer 100. When the ground portion of the reverse side 102 is subsequently made into the annular land 210, the annular land 210 is uniform in thickness.

In the processing apparatus 1 illustrated in FIG. 1, the first processing mechanism 30, etc. are supported on the first front surface 11*a* of the first column 11 that has the pentagonal horizontal cross-sectional shape, and the second processing mechanism 40, etc. are supported on the second front surface 11*b* of the first column 11. Furthermore, the third processing mechanism 50, etc. are supported on the front surface 12*a* of the second column 12 that has the trapezoidal horizontal cross-sectional shape.

Figure 9:
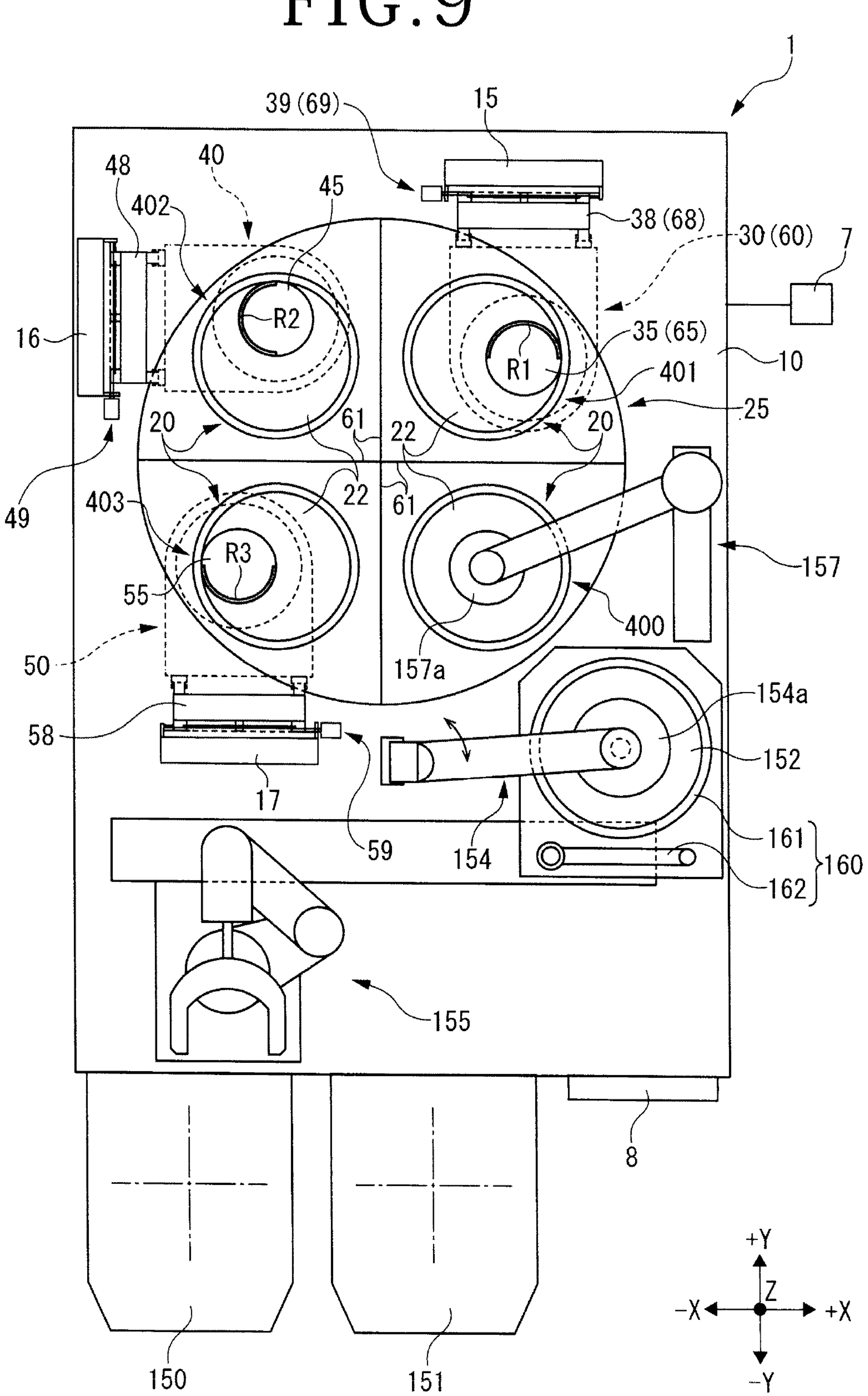
FIG. 9 is a top plan view illustrating structural details of a processing apparatus according to still another embodiment of the present invention.

As illustrated in FIG. 9, a processing apparatus 1 according to another embodiment of the present invention has a column 15, a column 16, and a column 17 rather than the first column 11 and the second column 12. The column 15 supports the first processing mechanism 30, etc. thereon. The column 16 supports the second processing mechanism 40, etc. thereon. The column 17 supports the third processing mechanism 50, etc. thereon.

The processing apparatus 1 may have at least four chuck tables 20, each for holding a wafer 100 on its holding surface 22, rotatably mounted on the turntable 25. Accordingly, five or more chuck tables 20 may be rotatably mounted on the turntable 25.

In the processing apparatus 1 illustrated in FIGS. 1, 7, and 9, the processing regions R1, R2, and R3 are established for the grindstones of the first, second, and third annular grinding wheels 35, 45, and 55 to abrasively contact the wafers 100 at the same positions thereon. However, the processing regions R1, R2, and R3 are not limited to the illustrated layout.

The processing region R2 may alternatively be positioned in point symmetry relation to the other processing regions R1 and R3 with respect to the center of the chuck table 20 providing the other processing regions R1 and R3 are established on the same chuck table 20. Specifically, the processing region R2 may be positioned in point symmetry relation to the other processing region R1 with respect to the center of the chuck table 20, and may also be positioned in point symmetry relation to the other processing region R3 with respect to the center of the chuck table 20.

With the alternative layout of the processing regions R1, R2, and R3, grinding marks left on the wafer 100 in the processing region R1 and grinding marks left on the wafer 100 in the processing region R2 can extend across each other, and grinding marks left on the wafer 100 in the processing region R2 and grinding marks left on the wafer 100 in the processing region R3 can extend across each other. Therefore, grinding marks are easily restrained from being left on the wafer 100.

Moreover, the second annular grinding wheel 45 that grinds the wafer 100 in the processing region R2 and the third annular grinding wheel 55 that grinds the wafer 100 in the processing region R3 undergo appropriate impact forces developed due to the crossing of the grinding marks, and hence are subjected to a self edge sharpening action. Consequently, the second annular grinding wheel 45 and the third annular grinding wheel 55 can also automatically be dressed for keeping their grinding capability.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing apparatus for grinding a central portion of a wafer to form a circular recess in the wafer and an annular land surrounding the circular recess, the processing apparatus comprising:

a turntable;

at least four chuck tables rotatably mounted on the turntable and having respective holding surfaces for holding respective wafers thereon;

a delivery mechanism for loading the wafer onto and unloading the wafer from each of the chuck tables;

a first processing mechanism for grinding the wafer held on one of the holding surfaces with a first annular grinding wheel to form the circular recess in a central portion of the wafer, leaving the annular land around the circular recess;

a second processing mechanism for grinding a bottom of the circular recess in the wafer held on the holding surface with a second annular grinding wheel;

a third processing mechanism for grinding the bottom of the circular recess in the wafer held on the holding surface with a third annular grinding wheel or polishing an upper surface of the wafer with a first polishing pad;

a first horizontally moving mechanism for moving the first annular grinding wheel of the first processing mechanism radially with respect to the wafer held on the one of the holding surfaces;

a second horizontally moving mechanism for moving the second annular grinding wheel of the second processing mechanism radially with respect to the wafer held on the holding surface; and a third horizontally moving mechanism for moving the third annular grinding wheel or the first polishing pad of the third processing mechanism radially with respect to the wafer held on the holding surface, wherein each of the first, second, and third horizontally moving mechanisms is configured to move a corresponding annular grinding wheel or polishing pad radially with respect to the wafer along a path in which a center of the corresponding annular grinding wheel or polishing pad passes through a center of the wafer.

2. The processing apparatus according to claim 1, wherein the chuck tables are movable to and positionable in a processing position at the first processing mechanism, a processing position at the second processing mechanism, a processing position at the third processing mechanism, and a delivery position into and from which each of the wafers is able to be loaded and unloaded by the delivery mechanism when the turntable is intermittently turned about its central axis, the processing apparatus further comprising:

a polishing mechanism for grinding an upper surface of the wafer held on the chuck table in the delivery position with a second polishing pad.

3. The processing apparatus according to claim 1, wherein the chuck tables are movable to and positionable in a processing position at the first processing mechanism, a processing position at the second processing mechanism, a processing position at the third processing mechanism, and a delivery position into and from which each of the wafers is able to be loaded and unloaded by the delivery mechanism when the turntable is intermittently turned about its central axis, the processing apparatus further comprising:

an outer circumferential upper surface grinding mechanism for grinding at least a portion, to be made into the annular land, of an upper surface of the wafer held on the chuck table in the delivery position with an outer circumferential upper surface grinding wheel.

4. The processing apparatus according to claim 1, wherein the second annular grinding wheel and the third annular grinding wheel each have a diameter and radial position selected to grind the bottom of the circular recess while being kept out of contact with an inner side surface of the circular recess.

5. The processing apparatus according to claim 1, wherein the first annular grinding wheel has a larger diameter than the second annular grinding wheel, and the second annular grinding wheel has a larger diameter than the third annular grinding wheel.

6. The processing apparatus according to claim 1, further comprising a first column and a second column erected on an apparatus base, wherein the first processing mechanism and the second processing mechanism are each supported on the first column, and the third processing mechanism is supported on the second column.

7. The processing apparatus according to claim 6, wherein the first column has a pentagonal cross-section shape and the second column has a trapezoidal horizontal cross-section shape.

8. The processing apparatus according to claim 6, wherein each of the first column and the second column includes a planar front surface facing toward the turntable.

9. The processing apparatus according to claim 1, wherein the first annular grinding wheel includes abrasive grains larger than abrasive grains of the second annular grinding wheel, and the second annular grinding wheel includes abrasive grains larger than abrasive grains of the third annular grinding wheel.

10. A processing apparatus for grinding a central portion of a wafer to form a circular recess in the wafer and an annular land surrounding the circular recess, the processing apparatus comprising:

a turntable;

at least four chuck tables rotatably mounted on the turntable and having respective holding surfaces for holding respective wafers thereon;

a delivery mechanism for loading the wafer onto and unloading the wafer from each of the chuck tables;

a second processing mechanism for grinding the wafer held on one of the holding surfaces with a second annular grinding wheel to form the circular recess in a central portion of the wafer, leaving the annular land around the circular recess;

a third processing mechanism for grinding a bottom of the circular recess in the wafer held on the holding surface with a third annular grinding wheel or polishing an upper surface of the wafer with a first polishing pad;

a fourth processing mechanism for grinding at least a portion, to be made into the annular land, of an upper surface of the wafer held on the holding surface with a fourth annular grinding wheel;

a second horizontally moving mechanism for moving the second annular grinding wheel of the second processing mechanism radially with respect to the wafer held on the one of the holding surfaces;

a third horizontally moving mechanism for moving the third annular grinding wheel or the first polishing pad of the third processing mechanism radially with respect to the wafer held on the holding surface; and a fourth horizontally moving mechanism for moving the fourth annular grinding wheel of the fourth processing mechanism radially with respect to the wafer held on the holding surface, wherein each of the second, third, and fourth horizontally moving mechanisms is configured to move a corresponding annular grinding wheel or polishing pad radially with respect to the wafer along a path in which a center of the corresponding annular grinding wheel or polishing pad passes through a center of the wafer.

11. The processing apparatus according to claim 10, wherein the chuck tables are movable to and positionable in a processing position at the second processing mechanism, a processing position at the third processing mechanism, a processing position at the fourth processing mechanism, and a delivery position into and from which each of the wafers is able to be loaded and unloaded by the delivery mechanism when the turntable is intermittently turned about its central axis, the processing apparatus further comprising:

a polishing mechanism for polishing an upper surface of the wafer held on the chuck table in the delivery position with a second polishing pad.

12. The processing apparatus according to claim 10, wherein the fourth processing mechanism is configured to grind the upper surface of the wafer while the chuck table is positioned in a delivery position.

13. The processing apparatus according to claim 10, wherein the fourth processing mechanism is supported on a column separate from columns supporting the second and third processing mechanisms.

* * * * *